United States Patent
Murofushi et al.

(10) Patent No.: US 8,053,167 B2
(45) Date of Patent: Nov. 8, 2011

(54) CURABLE COMPOSITIONS CONTAINING HYDROXYTHIOL COMPOUND, AND CURED PRODUCTS THEREOF

(75) Inventors: Katsumi Murofushi, Tokyo (JP); Haruhiko Ikeda, Tokyo (JP); Hideo Miyata, Tokyo (JP); Yotaro Hattori, Tokyo (JP)

(73) Assignee: Showa Denko K.K., Tokyo (JP)

( * ) Notice: Subject to any disclaimer, the term of this patent is extended or adjusted under 35 U.S.C. 154(b) by 171 days.

(21) Appl. No.: 12/515,214

(22) PCT Filed: Nov. 15, 2007

(86) PCT No.: PCT/JP2007/072171
§ 371 (c)(1),
(2), (4) Date: Jun. 9, 2009

(87) PCT Pub. No.: WO2008/062707
PCT Pub. Date: May 29, 2008

(65) Prior Publication Data
US 2010/0047713 A1 Feb. 25, 2010

(30) Foreign Application Priority Data
Nov. 21, 2006 (JP) ................................. 2006-314257

(51) Int. Cl.
*G03F 7/004* (2006.01)
*C08F 2/44* (2006.01)
*G02B 5/20* (2006.01)

(52) U.S. Cl. ............... 430/281.1; 430/287.1; 430/284.1; 430/285.1; 430/288.1; 430/7; 430/18; 522/49; 252/582

(58) Field of Classification Search ........................ None
See application file for complete search history.

(56) References Cited

U.S. PATENT DOCUMENTS

| 4,717,740 | A | * | 1/1988 | Hung et al. | ..................... 522/96 |
| 5,019,483 | A | * | 5/1991 | Lin et al. | ..................... 430/288.1 |
| 6,455,207 | B1 | | 9/2002 | Katoh et al. | |
| 7,341,828 | B2 | | 3/2008 | Katoh et al. | |
| 2006/0036023 | A1 | | 2/2006 | Kamata et al. | |

FOREIGN PATENT DOCUMENTS

| GB | 2 012 781 A | 8/1979 |
| JP | 10-101716 A | 4/1998 |
| JP | 10-253815 | 9/1998 |
| JP | 10-282325 A | 10/1998 |
| JP | 11-322848 A | 11/1999 |
| JP | 2000-249822 A | 9/2000 |
| JP | 2003-255121 A | 9/2003 |
| JP | 2004-149755 A | 5/2004 |
| JP | 2004-198542 A | 7/2004 |
| WO | 2004/055596 A1 | 7/2004 |
| WO | 2006/048443 A2 | 5/2006 |

OTHER PUBLICATIONS

Lecamp et al, Polymer, vol. 42, year 2001, Elseviers Science Ltd downloaded from www.elsevier.nl/locate/polymer, pp. 2727-2736.*

* cited by examiner

*Primary Examiner* — Cynthia Hamilton
(74) *Attorney, Agent, or Firm* — Sughrue Mion, PLLC

(57) ABSTRACT

Curable compositions have high sensitivity and excellent developability, and further have good storage properties as required. The compositions include a hydroxythiol compound represented by Formula (1) below and a compound with an ethylenically unsaturated double bond:

$$(HO)_l-X-\left[Y-(CH_2)_m-\underset{R_2}{\overset{R_1}{C}}-(CH_2)_n-SH\right]_k \quad (1)$$

wherein $R_1$ and $R_2$ are each independently a hydrogen atom, a C1-10 alkyl group or an aromatic ring; X is an aliphatic group, an aromatic ring-containing group or a heterocyclic ring-containing group; Y is an ester bond; k and l are each an integer ranging from 1 to 20; m is an integer of 0, 1 or 2; and n is 0 or 1.

21 Claims, No Drawings

CURABLE COMPOSITIONS CONTAINING HYDROXYTHIOL COMPOUND, AND CURED PRODUCTS THEREOF

FIELD OF THE INVENTION

The present invention relates to curable compositions that are used in coating materials, UV or heat curable paints, molding materials, adhesives, inks, optical materials, stereolithography materials, printing plate materials, resist materials and recording materials, and are particularly suited as optical materials. In more detail, the invention relates to curable compositions that contain a specific thiol compound and a compound with an ethylenically unsaturated double bond and are cured with heat or light.

BACKGROUND OF THE INVENTION

Compositions that are cured with heat or active lights such as UV rays are used in a wide range of fields including coating materials, UV or heat curable paints, molding materials, adhesives, inks, resist materials, optical materials, stereolithography materials, printing plate materials, dental materials, polymer battery materials and polymer materials. For example, uses as optical materials include coating materials for optical lenses or films, cladding materials for optical fibers, and optical adhesives for optical fibers or optical lenses.

Curable compositions are mainly composed of a photopolymerization or thermal polymerization initiator, a compound with an ethylenically unsaturated double bond that is cured by polymerization reaction, and additives. Types of the compositions are wide-ranged depending on use. In particular, the curing technique by the application of active energy rays such as UV rays and electron beams enables room temperature curing and quick drying without solvents, and is attractive in terms of environmental issues, energy saving, operation safety and production costs. Demands for this curing technique have been increasing.

In the development of color filters in particular, pigment-dispersed resists for color filters that are cured with light have been studied actively for the purposes of increased productivity and finer patterning. Studies have been also carried out to increase the plate-making speed and fineness in color proofs and printing plates. Additionally, solder resists for printed boards have been studied.

Compounds for curable compositions are selected depending on what wavelength of light they are sensitive to or how they are polymerizable. Compounds with an ethylenically unsaturated double bond and additives are selected depending on polymerizability and desired properties of cured products, and are used in combination as curable compositions. Demands for curable compositions in the above fields have been increasing, and there has been a demand for compositions that are curable with lower energy, compositions that are cured more quickly, compositions capable of forming finer patterns, compositions that are curable to a greater depth, compositions with higher storage properties, and compositions having enhanced developability.

However, some of the compounds with an ethylenically unsaturated double bond and additives have encountered problems that (1) sufficient energy to induce photopolymerization cannot be obtained, (2) storage properties are bad, (3) the light cannot reach deep in the composition because of the desired thickness of cured product, resulting in insufficient curing, (4) the curable composition is damaged by oxygen during contact with air, and (5) good developability is not obtained. These problems are dealt with by applying greater light energy, using an excessive amount of a photopolymerization initiator, or providing an oxygen-shielding membrane. However, curable compositions of excellent photocuring properties or storage properties are desired for energy saving and reduction of production costs.

In response to such demands, curable compositions having a thiol compound are increasingly studied recently. For example, JP-A-H10-253815 (Patent Document 1) discloses photopolymerizable compounds that contain a polyfunctional thiol and an initiator selected from biimidazole compounds, titanocene compounds, triazine compounds and oxazole compounds. JP-A-2000-249822 (Patent Document 2) discloses a photopolymerization initiator comprising a sensitizer, an organoboron complex and a mercapto compound. However, such attempts to increase the sensitivity with polyfunctional thiols result in bad storage properties.

JP-A-2004-149755 (Patent Document 3) teaches that secondary or tertiary thiol compounds give curable compositions having excellent photocurability and storage stability. However, the increase of aliphatic groups may likely deteriorate developability.

Patent Document 1: JP-A-H10-253815

Patent Document 2: JP-A-2000-249822

Patent Document 3: JP-A-2004-149755

DISCLOSURE OF THE INVENTION

Problems to be Solved by the Invention

It is an object of the invention to provide curable resin compositions that have high sensitivity and excellent developability, and further have good storage properties as required.

Means to Solve the Problems

The present inventors have found that the object of the invention is achieved by curable compositions including a hydroxythiol compound, and have completed the present invention based on the finding.

The present invention relates to:

[1] A curable composition comprising one, or two or more hydroxythiol compounds represented by Formula (1) below and a compound with an ethylenically unsaturated double bond:

[Chem. 1]

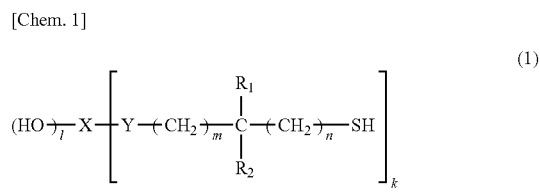

wherein $R_1$ and $R_2$ are each independently a hydrogen atom, a C1-10 alkyl group or an aromatic ring; X is an aliphatic group, an aromatic ring-containing group or a heterocyclic ring-containing group; Y is an ester bond; k and l are each an integer ranging from 1 to 20; m is an integer of 0, 1 or 2; and n is 0 or 1.

[2] The curable composition described in [1], wherein X in the hydroxythiol compound is a residue of at least one polyfunctional alcohol selected from the group consisting of alkylene glycols having a C2-10 optionally branched alkylene group, diethylene glycol, dipropylene glycol, glycerin, trimethylolpropane, pentaerythritol, dipentaerythritol, cyclohexanediol, cyclohexanedimethanol, norbornenedimethanol, tricyclodecanedimethanol, 1,3,5-trihydroxy-3-methylpentane, tris-2-hydroxy isocyanurate, tris(2-hydroxyethyl)isocyanurate, bisphenol A, hydrogenated bisphenol A, 2,2'-(4-(2-hydroxyethyl)phenyl)propane, 4,4'-(9-fluorenylidene)bis(2-phenoxyethanol), polyglycerin polyols and polycarbonate diols.

[3] The curable composition described in [1] or [2], wherein the hydroxythiol compound has an ester derivative structure represented by Formula (2) below:

[Chem. 2]

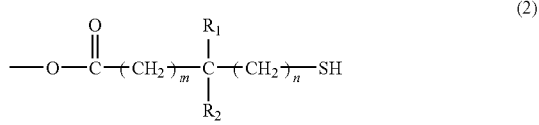

wherein $R_1$, $R_2$, m and n are the same as in Formula (1).

[4] The curable composition described in [3], wherein the ester derivative structure of Formula (2) is 2-mercaptoethyl ester group, 3-mercaptopropyl ester group, 2-mercaptopropyl ester group, 3-mercapto-3-phenylpropyl ester group, 3-mercaptobutyl ester group, 2-mercaptoisobutyl ester group, 2-mercapto-3-methylbutyl ester group, 3-mercapto-3-methylbutyl ester group, 3-mercaptopentyl ester group or 3-mercapto-4-methylpentyl ester group.

[5] The curable composition described in any of [1] to [4], wherein the composition further comprises a polyfunctional thiol compound that is free of hydroxyl groups.

[6] The curable composition described in any of [1] to [5], wherein the composition further comprises a thermal polymerization or photopolymerization initiator.

[7] A cured product obtained by curing the curable composition described in [6].

[8] A resist for color filters comprising the cured product described in [7].

The curable resin compositions according to the present invention achieve high sensitivity and excellent developability by containing the thiol compounds having both a mercapto group and a hydroxyl group, and the compositions further achieve good storage properties as required. The present invention will be described in detail hereinbelow.

BEST MODE FOR CARRYING OUT THE INVENTION

Embodiments of the invention will be described below.

A curable composition according to an embodiment of the present invention contains at least a hydroxythiol compound (A), a compound with an ethylenically unsaturated double bond (B), and a thermal polymerization or photopolymerization initiator (C), and may optionally contain a pigment, a sensitizer and an organic solvent as required.

(A) Hydroxythiol Compounds

The hydroxythiol compound that is a component for the curable compositions according to the invention is represented by Formula (1) below:

[Chem. 3]

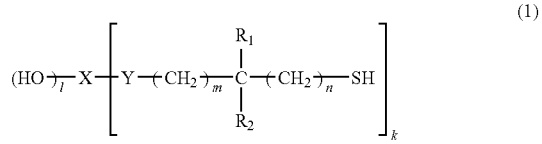

In Formula (1), $R_1$ and $R_2$ are each independently a hydrogen atom, a C1-10 alkyl group or an aromatic ring. The C1-10 alkyl groups may be linear or branched, and examples thereof include methyl, ethyl, n-propyl, iso-propyl, n-butyl, iso-butyl, tert-butyl, n-hexyl and n-octyl groups, with methyl and ethyl groups being preferred. It is more preferable that one of $R_1$ and $R_2$ is a hydrogen atom and the other is a C1-10 alkyl group, and particularly a methyl or ethyl group. The letter m is an integer of 0, 1 or 2, and is preferably 0 or 1. The letter n is 0 or 1, and is preferably 0.

The letter X is an aliphatic group, an aromatic ring-containing group or a heterocyclic ring-containing group, and has a valence of k+l. Preferably, this group is a residue of a C4-30 polyfunctional alcohol and is composed of carbon, oxygen and nitrogen; more preferably, nitrogen and oxygen are present as an isocyanurate group, and an ether bond or an isocyanurate group, respectively. Specific examples include residues of polyfunctional alcohols described later. The aliphatic groups include chain groups and cyclic groups. The letter Y is an ester bond represented by —COO— or —OOC—, and k and l are each an integer ranging from 1 to 20, and are preferably $2 \leq k+l \leq 20$, more preferably $2 \leq k+l \leq 15$, and more preferably $2 \leq k+l \leq 6$. The hydroxythiol compounds range in molecular weight from 150 to 10000, preferably 170 to 2000, and more preferably 200 to 1000.

Specific examples of the polyfunctional hydroxythiol compounds include polyfunctional hydroxythiol compounds (a) that have an ester structure represented by Formula (4) below:

[Chem. 4]

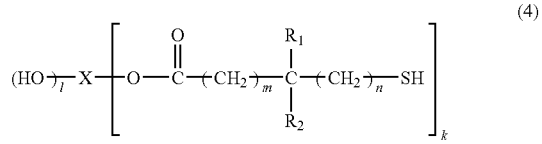

wherein $R_1$, $R_2$, X, k, l, m and n are the same as in Formula (1).

(a) Hydroxythiol Compounds with Ester Structure

The hydroxythiol compounds having an ester structure may be synthesized by esterifying a mercaptocarboxylic acid of Formula (2') below with an alcohol:

[Chem. 5]

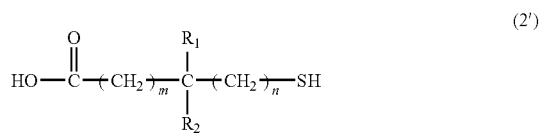

wherein $R_1$, $R_2$, m and n are the same as in Formula (1). Here, the alcohol is a polyfunctional alcohol so that the compound from the esterification will be a polyfunctional thiol compound.

The polyfunctional alcohols are not particularly limited. Specific examples of the polyfunctional alcohols include alkylene glycols having a C2-10 optionally branched alkylene group, diethylene glycol, dipropylene glycol, glycerin, trimethylolpropane, pentaerythritol, dipentaerythritol, cyclohexanediol, cyclohexanedimethanol, norbornenedimethanol, tricyclodecanedimethanol, 1,3,5-trihydroxy-3-methylpentane, tris-2-hydroxy isocyanurate, tris(2-hydroxyethyl)isocyanurate, bisphenol A, EO-modified bisphenol A, hydrogenated bisphenol A, 2,2'-(4-(2-hydroxyethyl)phenyl)propane, 4,4'-(9-fluorenylidene)bis(2-phenoxyethanol), polyglycerin polyols, polycarbonate diols, polysilicones with a hydroxyl group at both ends, and aromatic ring-containing polyols.

Preferred polyfunctional alcohols include trimethylolpropane, pentaerythritol, dipentaerythritol, glycerin and polyglycerin polyols.

Specific examples of the mercaptocarboxylic acids include thioglycolic acid, thiopropionic acid, 2-mercaptopropionic acid, 3-mercapto-3-phenylpropionic acid, 3-mercaptobutyric acid, 2-mercaptoisobutyric acid, 3-mercaptoisobutyric acid, 2-mercapto-3-methylbutyric acid, 3-mercapto-3-methylbutyric acid, 3-mercaptovaleric acid and 3-mercapto-4-methylvaleric acid. In view of storage properties, secondary or tertiary thiol compounds are preferred. The thiol compounds used in the invention are not limited to the above compounds.

(B) Compounds with Ethylenically Unsaturated Double Bond

The compound with an ethylenically unsaturated double bond that is a component for the curable compositions according to the invention is a compound curable by radical polymerization (or crosslinking) and addition reaction. Preferred examples include allyl alcohol derivatives, aromatic compounds containing an ethylenically unsaturated group, (meth)acrylates such as esters between (meth)acrylic acid and polyhydric alcohols, and urethane(meth)acrylates, (meth)acryl oligomers, and (meth)acryl copolymers containing an ethylenically unsaturated group. These compounds may be used singly, or two or more kinds may be used in combination.

In the invention, "(meth)acryloyl group" may refer to "acryloyl group and/or methacryloyl group"; "(meth)acryl" may refer to "acryl and/or methacryl"; and "(meth)acrylate" may refer to "methacrylate and/or acrylate".

Examples of the aromatic compounds containing an ethylenically unsaturated group include styrene, α-methylstyrene, o-methylstyrene, m-methylstyrene, p-methylstyrene, p-tert-butylstyrene, diisopropenylbenzene, o-chlorostyrene, m-chlorostyrene, p-chlorostyrene, 1,1-diphenylethylene, p-methoxystyrene, N,N-dimethyl-p-aminostyrene, N,N-diethyl-p-aminostyrene, ethylenically unsaturated pyridine and ethylenically unsaturated imidazole. Examples of the (meth)acrylates include carboxyl group-containing compounds such as (meth)acrylic acid, crotonic acid, maleic acid, fumaric acid and itaconic acid; alkyl(meth)acrylates such as methyl(meth)acrylate, ethyl(meth)acrylate, propyl(meth)acrylate, isopropyl(meth)acrylate, butyl(meth)acrylate, isobutyl(meth)acrylate, tert-butyl(meth)acrylate, pentyl(meth)acrylate, amyl(meth)acrylate, isoamyl(meth)acrylate, hexyl(meth)acrylate, heptyl(meth)acrylate, octyl(meth)acrylate, isooctyl(meth)acrylate, 2-ethylhexyl(meth)acrylate, nonyl(meth)acrylate, decyl(meth)acrylate, isodecyl(meth)acrylate, undecyl(meth)acrylate, dodecyl(meth)acrylate, lauryl(meth)acrylate, stearyl(meth)acrylate and isostearyl (meth)acrylate; fluoroalkyl(meth)acrylates such as trifluoroethyl(meth)acrylate, tetrafluoropropyl(meth)acrylate, hexafluoroisopropyl(meth)acrylate, octafluoropentyl (meth)acrylate and heptadecafluorodecyl(meth)acrylate; hydroxyalkyl(meth)acrylates such as hydroxyethyl(meth)acrylate, hydroxypropyl(meth)acrylate and hydroxybutyl (meth)acrylate; phenoxyalkyl(meth)acrylates such as phenoxyethyl(meth)acrylate and 2-hydroxy-3-phenoxypropyl (meth)acrylate; alkoxyalkyl(meth)acrylates such as methoxyethyl(meth)acrylate, ethoxyethyl(meth)acrylate, propoxyethyl(meth)acrylate, butoxyethyl(meth)acrylate and methoxybutyl(meth)acrylate; polyethylene glycol(meth)acrylates such as polyethylene glycol mono(meth)acrylate, ethoxydiethylene glycol(meth)acrylate, methoxypolyethylene glycol(meth)acrylate, phenoxypolyethylene glycol (meth)acrylate and nonylphenoxypolyethylene glycol(meth)acrylate; polypropylene glycol(meth)acrylates such as polypropylene glycol mono(meth)acrylate, methoxypolypropylene glycol(meth)acrylate, ethoxypolypropylene glycol(meth)acrylate and nonylphenoxypolypropylene glycol(meth)acrylate; cycloalkyl(meth)acrylates such as cyclohexyl(meth)acrylate, 4-butylcyclohexyl(meth)acrylate, dicyclopentanyl(meth)acrylate, dicyclopentenyl(meth)acrylate, dicyclopentadienyl(meth)acrylate, bornyl(meth)acrylate, isobornyl(meth)acrylate and tricyclodecanyl(meth)acrylate; benzyl(meth)acrylate, tetrahydrofurfuryl(meth)acrylate, ethylene glycol di(meth)acrylate, diethylene glycol di(meth)acrylate, triethylene glycol di(meth)acrylate, polyethylene glycol di(meth)acrylate, propylene glycol di(meth)acrylate, dipropylene glycol di(meth)acrylate, tripropylene glycol di(meth)acrylate, polypropylene glycol di(meth)acrylate, neopentyl glycol di(meth)acrylate, 1,3-propanediol di(meth)acrylate, 1,4-butanediol di(meth)acrylate, 1,6-hexanediol di(meth)acrylate, hydroxypivalate neopentyl glycol di(meth)acrylate, bisphenol A di(meth)acrylate, trimethylolpropane tri(meth)acrylate, pentaerythritol tri(meth)acrylate and trimethylolpropanetrioxyethyl(meth)acrylate. Examples of the urethane (meth)acrylates include tris(2-hydroxyethyl) isocyanurate tri(meth)acrylate and dipentaerythritol hexa(meth)acrylate.

Examples of the urethane(meth)acrylates further include compounds represented by Formulae (6), (7), (8), (9) and (10):

[Chem. 6]

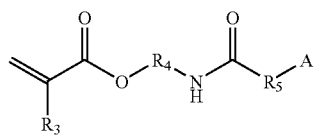

(6)

In Formula (6), $R_3$ represents a hydrogen atom or a methyl group; $R_4$ represents a C1-10 linear or branched alkylene group; $R_5$ is an oxygen atom, a sulfur atom or a NH group; and A represents an aliphatic group, an aromatic ring-containing group or a heterocyclic ring-containing group.

[Chem. 7]

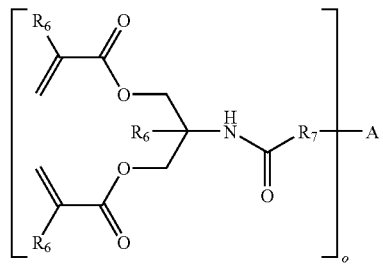

(7)

In Formula (7), $R_6$ represents a C1-10 linear or branched alkyl group; $R_7$ is an oxygen atom, a sulfur atom or a NH group; A represents an aliphatic group, an aromatic ring-containing group or a heterocyclic ring-containing group; and o is an integer ranging from 1 to 20.

[Chem. 8]

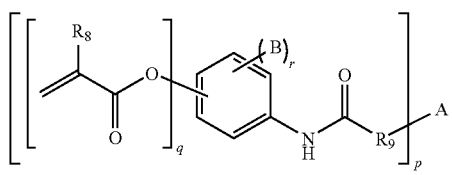

(8)

In Formula (8), $R_8$ represents a hydrogen atom or a methyl group; $R_9$ is an oxygen atom, a sulfur atom or a NH group; A represents an aliphatic group, an aromatic ring-containing group or a heterocyclic ring-containing group; B is independently a halogen atom or an electron-withdrawing group; p is an integer ranging from 1 to 20; q is an integer ranging from 1 to 5; r is an integer ranging from 0 to 4; and $1 \leq q+r \leq 5$.

[Chem. 9]

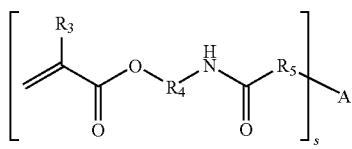

(9)

In Formula (9), $R_3$, $R_4$ and $R_5$ are the same as described in Formula (6); s is an integer ranging from 2 to 20; and A represents an aliphatic group, an aromatic ring-containing group or a heterocyclic ring-containing group.

[Chem. 10]

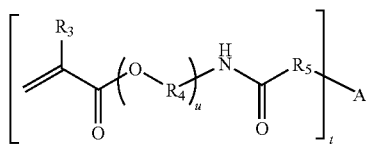

(10)

In Formula (10), $R_3$, $R_4$ and $R_5$ are the same as described in Formula (6); t is an integer ranging from 1 to 20; u is an integer ranging from 2 to 12; and A represents an aliphatic group, an aromatic ring-containing group or a heterocyclic ring-containing group.

The urethane(meth)acrylate compounds may be obtained by the reaction with known active hydrogen-containing compounds such as alcohols, amines and thiols, of isocyanate compounds containing an ethylenically unsaturated group such as 2-(meth)acryloyloxyethyl isocyanate, 4-(meth)acryloyloxybutyl isocyanate, 5-(meth)acryloyloxypropyl isocyanate, 6-(meth)acryloyloxyhexyl isocyanate, 2,2-bis(acryloyloxymethyl)ethyl isocyanate, 1,1-bis(acryloyloxymethyl) methyl isocyanate, 3-acryloyloxyphenyl isocyanate and 4-acryloyloxyphenyl isocyanate.

The active hydrogen-containing compounds used for the reaction are not particularly limited, but alcohols are preferable because of easy reaction. Specific examples include 2-hydroxyethyl(meth)acrylate, 3-hydroxypropyl(meth)acrylate, 4-hydroxybutyl(meth)acrylate, alkylene glycols having a C2-10 optionally branched alkylene group, diethylene glycol, dipropylene glycol, glycerin, trimethylolpropane, pentaerythritol, dipentaerythritol, cyclohexanediol, cyclohexanedimethanol, norbornenedimethanol, tricyclodecanedimethanol, 1,3,5-trihydroxy-3-methylpentane, tris-2-hydroxy isocyanurate, bisphenol A, hydrogenated bisphenol A, 2,2'-(4-(2-hydroxyethyl)phenyl)propane and 4,4'-(9-fluorenylidene)bis(2-phenoxyethanol). Examples further include polyglycerin polyols, polycarbonate diols, polysilicones with a hydroxyl group at both ends, and hydroxyl group-containing (meth)acryl copolymers. The active hydrogen compounds are not limited to the above examples.

(C) Thermal Polymerization or Photopolymerization Initiators

Polymerization initiators such as thermal polymerization or photopolymerization initiators may be used in the curable compositions of the invention. The photopolymerization initiators induce polymerization and addition reaction and thereby provide cured products by being irradiated with active energy rays such as UV rays, visible rays and electron beams. Specific examples of the photopolymerization initiators include 1-hydroxycyclohexyl phenyl ketone, 2,2'-dimethoxy-2-phenylacetophenone, xanthone, fluorene, fluorenone, benzaldehyde, anthraquinone, triphenylamine, carbazole, 3-methylacetophenone, 4-chlorobenzophenone, 4,4'-dimethoxybenzophenone, 4,4'-diaminobenzophenone, Michler's ketone, benzoylpropyl ether, benzoin ethyl ether, benzyldimethyl ketal, 1-(4-isopropylphenyl)-2-hydroxy-2-methylpropan-1-one, 2-hydroxy-2-methyl-1-phenylpropan-1-one, thioxanthone, diethylthioxanthone, 2-isopropylthioxanthone, 2-chlorothioxanthone, 2-methyl-1-[4-(methylthio)phenyl]-2-morpholinopropan-1-one, 2,4,6-trimethylbenzoyldiphenylphosphine oxide, 2-benzyl-2-dimethylamino-1-(4-morpholinophenyl)butan-1-one and 1-[4-(2-hydroxyethoxy)-phenyl]-2-hydroxy-2-methylpropan-1-one. They may be used singly, or two or more kinds may be used in combination. Of these, 2,4,6-trimethylbenzoyldiphenylphosphine oxide and 1-hydroxycyclohexyl phenyl ketone are preferred.

The polymerization may also be induced by heat to give cured products. That is, thermal polymerization initiators may be used in the curable compositions. In some cases, the addition reaction may be induced in the absence of thermal polymerization initiators.

Examples of the thermal polymerization initiators include azo compounds such as azobis(diphenylmethane), 2,2'-azobis(isobutyronitrile) and dimethyl-2,2'-azobis(2-methylpropionate); organic peroxides such as diacyl peroxides, ketone peroxides, hydroperoxides, dialkyl peroxides and peroxy esters; and persulfates. These compounds may be used singly, or two or more kinds may be used in combination. Specific examples of the organic peroxides include benzoyl peroxide, 3,5,5-trimethylhexanoyl peroxide, lauroyl peroxide, stearoyl peroxide, octanoyl peroxide, di-n-propyl peroxydicarbonate, diisopropyl peroxydicarbonate, bis(4-t-butylcyclohexyl)peroxydicarbonate, di-2-ethoxyethyl peroxydicarbonate, di-2-ethylhexyl peroxydicarbonate, di-2-methoxybutyl peroxydicarbonate, di(3-methyl-3-methoxybutyl)peroxydicarbonate, 1,1,3,3-tetramethylbutyl peroxyneodecanoate, 1-cyclohexyl-1-methylethyl peroxyneodecanoate, t-hexyl peroxyneodecanoate, t-butyl peroxyneodecanoate, t-hexyl peroxypivalate, t-butyl peroxypivalate, 1,1,3,3-tetramethylbutyl peroxy-2- ethylhexanoate, 1-cyclohexyl-1-methylethyl peroxy-2-ethylhexanoate and t-hexylperoxy-2-ethylhexanoate.

The curable compositions may contain various additives to achieve appropriate viscosity, handling properties or properties of cured products depending on use. For example, volatile solvents may be added to ensure that the components are sufficiently dispersed, to improve adhesion and handling properties in application, or to control the viscosity. The volatile solvents include alcohols, ketones and esters such as methanol, ethanol, toluene, cyclohexane, isophorone, cellosolve acetate, diethylene glycol dimethyl ether, ethylene glycol diethyl ether, xylene, ethylbenzene, methyl cellosolve, ethyl cellosolve, butyl cellosolve, propylene glycol monomethyl ether, isoamyl acetate, ethyl lactate, methyl ethyl ketone, acetone and cyclohexanone. These solvents may be used singly, or two or more kinds may be used in combination.

When the use of the volatile solvents is difficult in some uses, reactive solvents may be used, with examples including 2-hydroxyethyl(meth)acrylate, methyl(meth)acrylate, n-butyl(meth)acrylate, cyclohexyl(meth)acrylate, isobornyl (meth)acrylate, N,N-dimethylaminoethyl(meth)acrylate, N-acryloylmorpholine, N-acryloylpiperidine, N,N-dimethyl (meth)acrylamide, N-vinylpyrrolidone and N-vinylacetamide. These solvents may be used singly or as a mixture of two or more kinds thereof, or may be used together with the volatile solvents.

Complete photocuring by radical polymerization is generally difficult because the polymerization is inhibited by atmospheric oxygen at the interface with air. The general practice is to provide an air shielding layer such as a cover film to prevent oxygen from contacting with the surface, or to conduct photocuring in an inert gas atmosphere such as argon gas or nitrogen. The hydroxythiol compounds of the invention in combination with existing photopolymerization initiators and compounds with an ethylenically unsaturated double bond may give curable compositions that show improved sensitivity and good alkali developability due to the hydroxyl groups, and optionally possess excellent storage properties as required. Accordingly, it is preferable that any oxygen shielding layer is not used with the curable compositions according to the present invention. The curable compositions of the invention may be suitably used in applications where good developability is required, and for example may be suitably used together with high molecular weight polymers as color filter-forming curable compositions.

The high molecular weight polymers refer to polymers capable of forming uniform films with a thickness of 1 µm or more. Preferably, they are transparent high molecular weight polymers that have a transmittance of not less than 80%, and more preferably not less than 95% at all wavelengths of visible lights ranging from 400 to 700 nm. More preferably, they are soluble in developing solutions (solvents or aqueous alkaline solutions).

The high molecular weight polymers include heat curable resins, thermoplastic resins and photosensitive resins. Specific examples are polymers such as polyacrylates, poly-α-alkyl acrylates, polyamides, polyvinylacetals, polyurethanes, polycarbonates, polystyrenes, polyvinyl esters, phenolic resins, epoxy resins, novolak resins and alkyd resins and copolymers thereof. They may be used singly, or two or more kinds may be used in combination. The high molecular weight polymers may contain a radically polymerizable ethylenically unsaturated bonding group so that the curing reaction of the curable compositions will be accelerated or properties of the cured products will be improved. When the cured products will be used as permanent films or used in manufacturing steps where durability is required such as production of color filters, the high molecular weight polymers preferably have high heat resistance and temporal stability against high temperature treatments or treatments with solvents or chemicals in post steps in the production.

Sensitizers may be used to further increase the sensitivity of the curable compositions. Specific examples include benzophenone compounds such as benzophenone, 2,4,6-trimethylbenzophenone, 4-phenylbenzophenone, 4,4'-bis(dimethylamino)benzophenone and 4,4'-bis(diethylamino) benzophenone; and thioxanthone compounds such as 2,4-diethylthioxanthone, isopropylthioxanthone, 2,4-diisopropylthioxanthone and 2-chlorothioxanthone.

Pigments may be used as required. Specific examples are indicated below with their color index numbers: C. I. Pigment Yellow 12, 13, 14, 17, 20, 24, 55, 83, 86, 93, 109, 110, 117, 125, 137, 139, 147, 148, 153, 154, 166, 168, C. I. Pigment Orange 36, 43, 51, 55, 59, 61, C. I. Pigment Red 9, 97, 122, 123, 149, 168, 177, 180, 192, 215, 216, 217, 220, 223, 224, 226, 227, 228, 240, C. I. Pigment Violet 19, 23, 29, 30, 37, 40, 50, C. I. Pigment Blue 15, 15:1, 15:4, 15:6, 22, 60, 64, C. I. Pigment Green 7, 36, C. I. Pigment Brown 23, 25, 26, C. I. Pigment Black 7, and titanium black. The pigments may be used singly, or two or more kinds may be used in combination.

The curable compositions may contain hydroxyl-free monofunctional or polyfunctional thiol compounds to adjust sensitivity or developability. In particular, polyfunctional thiol compounds are preferable because high elastic modulus, surface hardness, solvent resistance and water resistance are ensured without drastically deteriorating the crosslinking density. Specific examples include but are not limited to trimethylolpropane tris(3-mercaptopropionate), trimethylolpropane tris(3-mercaptobutyrate), pentaerythritol tetrakis(3-mercaptopropionate) and pentaerythritol tetrakis(3-mercaptobutyrate).

The curable compositions may contain fluorescent whitening agents, surfactants, plasticizers, flame-retardants, antioxidants, UV absorbers, foaming agents, fungicides, antistatic agents, magnetic substances, conductive materials, antibacterial agents, germicidal agents, porous adsorbents, perfumes, adhesion improvers such as silane coupling agents and acidic phosphates, curing accelerators, dyes, fillers, thixotropic agents and lubricants as required.

The amounts of the components in the curable compositions of the invention are not limited in particular, but are generally as follows.

When the compound with an ethylenically unsaturated double bond and the high molecular weight polymer are used together, the amount of the high molecular weight polymer is generally 1 to 300 parts by mass, and preferably 50 to 200 parts by mass based on 100 parts by mass of the compound with an ethylenically unsaturated double bond. Using the high molecular weight polymer in amounts more than 300 parts by mass may result in lowered solubility of UV-unexposed portions in developing solutions. If the amount of the high molecular weight polymer is less than 1 part by mass, the obtainable composition may have insufficient sensitivity with light.

The amount of the thermal polymerization or photopolymerization initiator is generally 2 to 400 parts by mass, and preferably 20 to 200 parts by mass based on 100 parts by mass of the compound with an ethylenically unsaturated double bond.

The hydroxythiol compound is generally used in an amount of 1 to 200 parts by mass, and preferably 2 to 150 parts by mass based on 100 parts by mass of the compound with an ethylenically unsaturated double bond. If the amount of the hydroxythiol compound is excessively small, the polymerization may not be initiated efficiently. Excessive use of the hydroxythiol compound will not correspondingly facilitate the polymerization initiation and may adversely affect properties of cured products.

The sensitizer is preferably used in an amount of 1 to 60 parts by mass, and more preferably 2 to 50 parts by mass based on 100 parts by mass of the compound with an ethylenically unsaturated double bond. Excessively small amounts of the sensitizer may not provide sensitizing effects, and excessively large amounts thereof may lower polymerization initiation efficiency because the sensitizer absorbs light to deteriorate light transmission efficiency.

The pigment is generally used in an amount of about 100 to 2000 parts by mass based on 100 parts by mass of the compound with an ethylenically unsaturated double bond.

The curable compositions may contain thermal polymerization inhibitors to prevent polymerization during storage. Specific examples of the thermal polymerization inhibitors include p-methoxyphenol, hydroquinone, catechol, tert-butylcatechol, phenothiazine and methoquinone.

When the composition is formed as a dispersion, a polymerization inhibitor may be added to prevent gelation by polymerization or the like. Dispersing agents may be appropriately used so that the pigments will be dispersed favorably. The dispersing agents facilitate the dispersing of the pigments and prevent reaggregation after the pigments are dispersed. Extender pigments such as barium sulfate, calcium carbonate, silica, titania, alumina and aluminum powder may be used to obtain appropriate flowability or to obtain light-blocking properties or mechanical and physical properties of cured products.

The curable compositions of the invention may be produced by mixing the aforementioned components with various dispersing means such as three roll mills, two roll mills, sand mills, attritors, ball mills, kneaders and paint shakers. The hydroxythiol compounds, the compounds with an ethylenically unsaturated double bond and the thermal polymerization or photopolymerization initiators may be added after the pigments are dispersed.

The curable compositions may form films on substrates such as glass, aluminum and polyester films such as polyethylene terephthalate (PET), by application methods such as spray coating, spinner coating, roll coating, screen coating, spread coating, dip coating and calender coating.

To achieve appropriate coating properties, the curable compositions may contain small amounts of silicon- or fluorine-containing surfactants as leveling agents or anti-foaming agents. After the curable composition is applied, the volatile solvents are dried with a hot air oven or a hot plate as required, generally at 60 to 100° C. for 10 to 30 minutes. Excessively high drying temperatures or excessively long drying time can induce partial polymerization or crosslinking, and the solubility of unexposed portions in developing solutions may be lowered resulting in burn-in. The drying may be performed under reduced pressure.

The dried films are then exposed to light. Depending on use, the films may be UV exposed through a patterned photomask. General light sources include ultrahigh pressure mercury lamps, metal halide lamps and xenon lamps. Depending on use or the type of the substrate, heat ray-cutting filters or wavelength selective filters may be used. After the films are photoexposed, uncured portions are removed to form patterns on the substrates.

The curable compositions may be generally formed into a predetermined pattern in two manners. In the first method, the curable composition is applied in a predetermined shape and is cured by irradiation. In the second method, the curable composition is applied evenly on the substrate and is cured by being exposed to light such that the exposed portions will form a desired shape; thereafter, the unexposed portions are removed by means such as washing, peeling, mechanical polishing or chemical polishing, and the remaining cured product forms a pattern. The patterns formed of the curable compositions of the invention refer to photocured products of the curable compositions that are formed with a specific shape on the substrates. Specific examples of the patterns include patterns used in the fields of optical plate-making resists, solder resists, etching resists, color filter resists, holography patterns, stereolithography patterns and UV ink patterns. The curable compositions of the invention are particularly suited as developable resists for fine patterning.

The substrates for the pattern production in the invention include inorganic materials such as glass and silicon; metal materials such as aluminum, stainless steel and copper; resin materials such as PET, polyesters, polyimides, epoxy resins, polyethylenes and polycarbonates; and paper. The surface of the substrates may be subjected to oxidation treatment, acid treatment, plasma treatment or discharge treatment to improve the adhesion of the curable compositions. Because the curable compositions are present on the surface of the substrates, the thickness of the substrates may be determined as appropriate. A resin layer or the like that is not involved in the photoreaction may be provided between the curable composition and the substrate.

In the pattern production where the uncured portions of the curable composition are dissolved away (treated for development) after the irradiation, the solvents for the developing solutions include organic solvents such as N-methylpyrrolidone, methanol, ethanol, toluene, cyclohexane, isophorone, cellosolve acetate, diethylene glycol dimethyl ether, ethylene glycol diethyl ether, xylene, ethylbenzene, methyl cellosolve, ethyl cellosolve, butyl cellosolve, propylene glycol monomethyl ether, propylene glycol monomethyl ether acetate, isoamyl acetate, ethyl lactate, methyl ethyl ketone, acetone, cyclohexanone, N,N-dimethylformamide and acetonitrile, and aqueous alkaline solutions. These may be used singly, or two or more kinds may be used in combination. Basic substances such as trimethylamine and triethylamine, and surfactants may be added to the solvents.

Examples of the aqueous alkaline solutions include aqueous solutions of inorganic salts such as sodium hydroxide, potassium hydroxide, sodium carbonate and potassium carbonate; and aqueous solutions of organic salts such as hydroxytetramethyl ammonium and hydroxytetraethyl ammonium. These may be used singly, or two or more kinds may be used in combination.

EXAMPLES

The present invention will be described based on Examples hereinbelow without limiting the scope of the invention. In Examples, parts and % refer to parts by mass and % by mass, respectively.

Synthesis of Hydroxythiol Compounds

Synthesis Example 1

Synthesis of pentaerythritol tris(3-mercaptobutyrate) (PE3MB)

A 200 ml three-necked flask was charged with 15.0 g (110.2 mmol) of pentaerythritol (manufactured by TOKYO CHEMICAL INDUSTRY CO., LTD.), 26.5 g (220.3 mmol) of 3-mercaptobutanoic acid (manufactured by YODO KAGAKU CO., LTD.), 1.8 g (9.3 mmol) of p-toluenesulfonic acid monohydrate (manufactured by JUNSEI CHEMICAL CO., LTD.) and 35 g of toluene (manufactured by JUNSEI CHEMICAL CO., LTD.). A Dean-Stark apparatus and a condenser tube were attached. The materials were heated in an oil bath at 130° C. with stirring. After 4 hours after the reaction was initiated, 13.3 g (110.1 mmol) of 3-mercaptobutanoic acid was added. Further, 0.85 g (4.5 mmol) of p-toluenesulfonic acid monohydrate was added after 6 hours from the initiation of the reaction. The reaction was carried out for another 4 hours. The reaction liquid was allowed to cool, was neutralized with 200 ml of a saturated aqueous sodium hydrogen carbonate solution, and was washed twice with 200 ml of pure water. The reaction liquid was then dehydrated and dried over anhydrous magnesium sulfate (manufactured by JUNSEI CHEMICAL CO., LTD.) and was distilled to remove the toluene, thereby giving a mixture containing the target compound. PE3MB obtained was a colorless transparent liquid and weighed 22.5 g, providing 47% yield. The composition formula of PE3MB was C17H30O7S3 and the molecular weight was 442.61.

Synthesis Example 2

Synthesis of dipentaerythritol pentakis(3-mercaptobutyrate) (DP5MB)

A 500 ml three-necked flask was charged with 19.1 g (75 mmol) of dipentaerythritol (manufactured by TOKYO CHEMICAL INDUSTRY CO., LTD.), 54.1 g (450.0 mmol) of 3-mercaptobutanoic acid (manufactured by YODO KAGAKU CO., LTD.), 1.7 g (9.0 mmol) of p-toluenesulfonic acid monohydrate (manufactured by JUNSEI CHEMICAL CO., LTD.) and 300 g of toluene (manufactured by JUNSEI CHEMICAL CO., LTD.). A Dean-Stark apparatus and a condenser tube were attached. The materials were heated in an oil bath at 130° C. with stirring. After 1.5 hours after the reaction was initiated, 0.85 g (4.5 mmol) of p-toluenesulfonic acid monohydrate was added. Further, 1.7 g (9.0 mmol) of p-toluenesulfonic acid monohydrate was added after 4 hours from the initiation of the reaction. The reaction was carried out for another 2 hours. The reaction liquid was allowed to cool, was neutralized with 300 ml of a saturated aqueous sodium hydrogen carbonate solution, and was washed twice with 250 ml of pure water. The reaction liquid was then dehydrated and dried over anhydrous magnesium sulfate (manufactured by JUNSEI CHEMICAL CO., LTD.) and was distilled to remove the toluene, thereby giving a mixture containing the target compound. DP5MB obtained was a colorless transparent liquid and weighed 4.5 g, providing 13% yield. The composition formula of DP5MB was $C_{30}H_{52}O_{12}S_5$ and the molecular weight was 765.06.

Synthesis Example 3

Synthesis of tris(2-hydroxyethyl)isocyanurate bis(3-mercaptobutyrate) (THI2MB)

A 500 ml three-necked flask was charged with 26.1 g (100 mmol) of tris(2-hydroxyethyl) isocyanurate (manufactured by TOKYO CHEMICAL INDUSTRY CO., LTD.), 18.0 g (150.0 mmol) of 3-mercaptobutanoic acid (manufactured by YODO KAGAKU CO., LTD.), 0.6 g (3.0 mmol) of p-toluenesulfonic acid monohydrate (manufactured by JUNSEI CHEMICAL CO., LTD.) and 300 g of toluene (manufactured by JUNSEI CHEMICAL CO., LTD.). A Dean-Stark apparatus and a condenser tube were attached. The materials were heated in an oil bath at 130° C. with stirring. After 4 hours after the reaction was initiated, 6.01 g (50.0 mmol) of 3-mercaptobutanoic acid was added. Further, 1.9 g (10 mmol) of p-toluenesulfonic acid monohydrate was added after 6 hours from the initiation of the reaction. The reaction was carried out for another 4 hours. The reaction liquid was allowed to cool, was neutralized with 200 ml of a saturated aqueous sodium hydrogen carbonate solution, and was washed twice with 200 ml of pure water. The reaction liquid was then dehydrated and dried over anhydrous magnesium sulfate (manufactured by JUNSEI CHEMICAL CO., LTD.) and was distilled to remove the toluene, thereby giving a mixture containing the target compound. THI2MB obtained was a colorless transparent liquid, and the yield was 28%. The composition formula of THI2MB was $C_{17}H_{27}O_8S_2$ and the molecular weight was 465.54.

Synthesis Example 4

Synthesis of pentaerythritol tris(3-mercaptopropionate) (PE3MP)

A 200 ml three-necked flask was charged with 15.0 g (110.2 mmol) of pentaerythritol (manufactured by TOKYO CHEMICAL INDUSTRY CO., LTD.), 23.4 g (220.3 mmol) of 3-mercaptopropionic acid (manufactured by YODO KAGAKU CO., LTD.), 1.8 g (9.3 mmol) of p-toluenesulfonic acid monohydrate (manufactured by JUNSEI CHEMICAL CO., LTD.) and 35 g of toluene (manufactured by JUNSEI CHEMICAL CO., LTD.). A Dean-Stark apparatus and a condenser tube were attached. The materials were heated in an oil bath at 130° C. with stirring. After 4 hours after the reaction was initiated, 11.7 g (110.1 mmol) of 3-mercaptopropionic acid was added. Further, 0.85 g (4.5 mmol) of p-toluenesulfonic acid monohydrate was added after 6 hours from the initiation of the reaction. The reaction was carried out for another 4 hours. The reaction liquid was allowed to cool, was neutralized with 200 ml of a saturated aqueous sodium hydrogen carbonate solution, and was washed twice with 200 ml of pure water. The reaction liquid was then dehydrated and dried over anhydrous magnesium sulfate (manufactured by JUNSEI CHEMICAL CO., LTD.) and was distilled to remove the toluene, thereby giving a mixture containing the target compound. PE3MP obtained was a colorless transparent liquid and weighed 14.1 g, providing 32% yield. The composition formula of PE3MP was $C_{14}H_{34}O_7S_4$ and the molecular weight was 400.53.

Synthesis Example 5

Synthesis of pentaerythritol tris(2-mercaptoisobutyrate) (PE3MIB)

A 200 ml three-necked flask was charged with 15.0 g (110.2 mmol) of pentaerythritol (manufactured by TOKYO CHEMICAL INDUSTRY CO., LTD.), 26.5 g (220.3 mmol) of 2-mercaptoisobutanoic acid, 1.8 g (9.3 mmol) of p-toluenesulfonic acid monohydrate (manufactured by JUNSEI CHEMICAL CO., LTD.) and 35 g of toluene (manufactured by JUNSEI CHEMICAL CO., LTD.). A Dean-Stark apparatus and a condenser tube were attached. The materials were heated in an oil bath at 130° C. with stirring. After 4 hours after the reaction was initiated, 13.3 g (110.1 mmol) of 2-mercaptoisobutanoic acid was added. Further, 0.85 g (4.5 mmol) of p-toluenesulfonic acid monohydrate was added after 6 hours from the initiation of the reaction. The reaction was carried out for another 4 hours. The reaction liquid was allowed to cool, was neutralized with 200 ml of a saturated aqueous sodium hydrogen carbonate solution, and was washed twice with 200 ml of pure water. The reaction liquid was then dehydrated and dried over anhydrous magnesium sulfate (manufactured by JUNSEI CHEMICAL CO., LTD.) and was distilled to remove the toluene, thereby giving a mixture containing the target compound. PE3MIB obtained was a colorless transparent liquid and weighed 14.4 g, providing 30% yield. The composition formula of PE3MIB was $C_{17}H_{30}O_7S_3$ and the molecular weight was 442.61.

Synthesis Example 6

Synthesis of pentaerythritol tris(3-mercapto-3-phenyl propionate) (PE3MPP)

A 200 ml three-necked flask was charged with 15.0 g (110.2 mmol) of pentaerythritol (manufactured by TOKYO CHEMICAL INDUSTRY CO., LTD.), 40.1 g (220.3 mmol) of 3-mercapto-3-phenylpropionic acid, 1.8 g (9.3 mmol) of p-toluenesulfonic acid monohydrate (manufactured by JUNSEI CHEMICAL CO., LTD.) and 35 g of toluene (manufactured by JUNSEI CHEMICAL CO., LTD.). A Dean-Stark apparatus and a condenser tube were attached. The materials were heated in an oil bath at 130° C. with stirring. After 4 hours after the reaction was initiated, 20.0 g (110.1 mmol) of 3-mercapto-3-phenylpropionic acid was added. Further, 0.85 g (4.5 mmol) of p-toluenesulfonic acid monohydrate was added after 6 hours from the initiation of the reaction. The reaction was carried out for another 4 hours. The reaction liquid was allowed to cool, was neutralized with 200 ml of a saturated aqueous sodium hydrogen carbonate solution, and was washed twice with 200 ml of pure water. The reaction liquid was then dehydrated and dried over anhydrous magnesium sulfate (manufactured by JUNSEI CHEMICAL CO., LTD.) and was distilled to remove the toluene, thereby giving a mixture containing the target compound. PE3MPP obtained was a colorless transparent liquid and weighed 17.32 g, providing 25% yield. The composition formula of PE3MPP was $C_{32}H_{36}O_7S_3$ and the molecular weight was 628.82.

Synthesis of Binder Resin

Synthesis Example 7

Synthesis of Carboxyl Side Group-Containing Binder Resin (EP-1)

185 g of EPIKOTE 1004 (bisphenol A epoxy resin, manufactured by Japan Epoxy Resins, Co., Ltd., epoxy equivalent: 925), 14.4 g of acrylic acid, 0.20 g of hydroquinone and 197 g of diethylene glycol monoethyl ether acetate (hereinafter DGEA, manufactured by DAICEL CHEMICAL INDUSTRIES, LTD.) were charged into a reactor and were heated to 95° C. After the mixture was confirmed to be uniformly dissolved, 2.0 g of triphenylphosphine was added, and the mixture was heated to 100° C. and was reacted for about 30 hours to give a reaction product having an acid value of 0.5 mg KOH/g. Subsequently, 96.0 g of tetrahydrophthalic anhydride (manufactured New Japan Chemical Co., Ltd.) was added, and the mixture was heated to 90° C. and was reacted for about 6 hours. By confirming the disappearance of the absorption peaks assigned to the acid anhydride by IR, an epoxy acrylate resin EP-1 with a solid acid value of 119 mg KOH/g and a solid concentration of 60% was obtained.

[Preparation of Pigment Dispersion]

1.98 g of AJISPER PB822 (pigment dispersing agent, manufactured by Ajinomoto Fine-Techno Co., Ltd.) was placed in a 300 ml stainless steel can and was dissolved with 113.5 g of propylene glycol monomethyl ether acetate (hereinafter PMA, manufactured by DAICEL CHEMICAL INDUSTRIES, LTD.). The solution was mixed with 12.54 g of the resin EP-1, 15.0 g of Special Black 350 (carbon black, manufactured by DEGUSSA), and 15.0 g of 13M-C (titanium black, manufactured by Mitsubishi Materials Corporation). The mixture was subjected to dispersing treatment for 3 hours in a paint conditioner (manufactured by ASADA IRON WORKS, CO., LTD.) together with 200 g of zirconia beads with 0.65 mm diameter. The resultant pigment dispersion was filtered through a 0.8 μm filter paper to give a black pigment dispersion.

[Preparation of Curable Compositions]

Curable compositions were prepared according to Table 1 in Examples 1 to 7 and according to Table 2 in Comparative Examples 1 to 4.

In detail, the black pigment dispersion, compounds with an ethylenically unsaturated double bond, sensitizer, photopolymerization initiator, thiol compound and leveling agent were combined with cyclohexanone as a solvent and were mixed until the components gave a uniform dispersion as a curable composition as shown in Table 1 or 2.

TABLE 1

| | | | Ex. 1 | | Ex. 2 | | Ex. 3 | | Ex. 4 | |
|---|---|---|---|---|---|---|---|---|---|---|
| | Curable composition | | Amount (g) | Composition ratio in terms of solid (% by mass) | Amount (g) | Composition ratio in terms of solid (% by mass) | Amount (g) | Composition ratio in terms of solid (% by mass) | Amount (g) | Composition ratio in terms of solid (% by mass) |
| Black pigment dispersion | Total | | 65.0 | 84.4 | 65.0 | 84.4 | 65.0 | 84.4 | 65.0 | 84.4 |
| | Components | Special Black 350 *1 | (6.18) | (32.1) | (6.18) | (32.1) | (6.18) | (32.1) | (6.18) | (32.1) |
| | | 13M-C *2 | (6.18) | (32.1) | (6.18) | (32.1) | (6.18) | (32.1) | (6.18) | (32.1) |
| | | AJISPER PB822 *3 | (0.81) | (4.2) | (0.81) | (4.2) | (0.81) | (4.2) | (0.81) | (4.2) |
| | | EP-1 | (3.09) | (16.0) | (3.09) | (16.0) | (3.09) | (16.0) | (3.09) | (16.0) |
| | | PMA *4 | (46.68) | — | (46.68) | — | (46.68) | — | (46.68) | — |
| | | DGEA *5 | (2.06) | — | (2.06) | — | (2.06) | — | (2.06) | — |
| Compounds with ethylenically unsaturated bond | Light Acrylate BP-4EA *6 | | 0.20 | 1.0 | 0.20 | 1.0 | 0.20 | 1.0 | 0.20 | 1.0 |
| | ARONIX M-400 *7 | | 0.50 | 2.6 | 0.50 | 2.6 | 0.50 | 2.6 | 0.50 | 2.6 |
| Sensitizer | EMK *8 | | 0.30 | 1.5 | 0.30 | 1.5 | 0.30 | 1.5 | 0.30 | 1.5 |
| Photopolymerization initiator | IRGACURE 907 *9 | | 1.00 | 5.2 | 1.00 | 5.2 | 1.00 | 5.2 | 1.00 | 5.2 |

TABLE 1-continued

| Thiol | Thiol (Amount) | 1.00 | 5.20 | 1.00 | 5.20 | 1.00 | 5.20 | 1.00 | 5.20 |
|---|---|---|---|---|---|---|---|---|---|
| | compound (Type) | PE3MB | | DP5MB | | THI2MB | | PE3MP | |
| Organic solvent | Cyclohexanone | 31.98 | — | 31.98 | — | 31.98 | — | 31.98 | — |
| Leveling agent | MEGAFACE R08 *10 | 0.02 | 0.1 | 0.02 | 0.1 | 0.02 | 0.1 | 0.02 | 0.1 |
| | Total | 100.0 | 100.0 | 100.0 | 100.0 | 100.0 | 100.0 | 100.0 | 100.0 |

| | | Ex. 5 | | Ex. 6 | | Ex. 7 | |
|---|---|---|---|---|---|---|---|
| Curable composition | | Amount (g) | Composition ratio in terms of solid (% by mass) | Amount (g) | Composition ratio in terms of solid (% by mass) | Amount (g) | Composition ratio in terms of solid (% by mass) |
| Black pigment dispersion | Total | 65.0 | 84.4 | 65.0 | 84.4 | 65.0 | 84.4 |
| | Components Special Black 350 *1 | (6.18) | (32.1) | (6.18) | (32.1) | (6.18) | (32.1) |
| | 13M-C *2 | (6.18) | (32.1) | (6.18) | (32.1) | (6.18) | (32.1) |
| | AJISPER PB822 *3 | (0.81) | (4.2) | (0.81) | (4.2) | (0.81) | (4.2) |
| | EP-1 | (3.09) | (16.0) | (3.09) | (16.0) | (3.09) | (16.0) |
| | PMA *4 | (46.68) | — | (46.68) | — | (46.68) | — |
| | DGEA *5 | (2.06) | — | (2.06) | — | (2.06) | — |
| Compounds with ethylenically unsaturated bond | Light Acrylate BP-4EA *6 | 0.20 | 1.0 | 0.20 | 1.0 | 0.20 | 1.0 |
| | ARONIX M-400 *7 | 0.50 | 2.6 | 0.50 | 2.6 | 0.50 | 2.6 |
| Sensitizer | EMK *8 | 0.30 | 1.5 | 0.30 | 1.5 | 0.30 | 1.5 |
| Photopolymerization initiator | IRGACURE 907 *9 | 1.00 | 5.2 | 1.00 | 5.2 | 1.00 | 5.2 |
| Thiol | Thiol (Amount) | 1.00 | 5.20 | 1.00 | 5.20 | 1.00 | 5.20 |
| | compound (Type) | PE3MIB | | PE3MPP | | PE3MB:PEMB weight ratio 50:50 mixture | |
| Organic solvent | Cyclohexanone | 31.98 | — | 31.98 | — | 31.98 | — |
| Leveling agent | MEGAFACE R08 *10 | 0.02 | 0.1 | 0.02 | 0.1 | 0.02 | 0.1 |
| | Total | 100.0 | 100.0 | 100.0 | 100.0 | 100.0 | 100.0 |

TABLE 2

| | | | Comp. Ex. 1 | | Comp. Ex. 2 | | Comp. Ex. 3 | | Comp. Ex. 4 | |
|---|---|---|---|---|---|---|---|---|---|---|
| Curable composition | | | Amount (g) | Composition ratio in terms of solid (% by mass) | Amount (g) | Composition ratio in terms of solid (% by mass) | Amount (g) | Composition ratio in terms of solid (% by mass) | Amount (g) | Composition ratio in terms of solid (% by mass) |
| Black pigment dispersion | Total | | 65.0 | 88.9 | 65.0 | 84.4 | 65.0 | 84.4 | 65.0 | 84.4 |
| | Compo-nents | Special Black 350 *1 | (6.18) | (33.8) | (6.18) | (32.1) | (6.18) | (32.1) | (6.18) | (32.1) |
| | | 13M-C *2 | (6.18) | (33.8) | (6.18) | (32.1) | (6.18) | (32.1) | (6.18) | (32.1) |
| | | AJISPER PB822 *3 | (0.81) | (4.4) | (0.81) | (4.2) | (0.81) | (4.2) | (0.81) | (4.2) |
| | | EP-1 | (3.09) | (16.9) | (3.09) | (16.0) | (3.09) | (16.0) | (3.09) | (16.0) |
| | | PMA *4 | (46.68) | — | (46.68) | — | (46.68) | — | (46.68) | — |
| | | DGEA *5 | (2.06) | — | (2.06) | — | (2.06) | — | (2.06) | — |
| Compounds with ethylenically unsaturated bond | Light Acrylate BP-4EA *6 | | 0.20 | 1.1 | 0.20 | 1.0 | 0.20 | 1.0 | 0.20 | 1.0 |
| | ARONIX M-400 *7 | | 0.50 | 2.7 | 0.50 | 2.6 | 0.50 | 2.6 | 0.50 | 2.6 |
| Sensitizer | EMK *8 | | 0.30 | 1.6 | 0.30 | 1.5 | 0.30 | 1.5 | 0.30 | 1.5 |
| Photopolymerization initiator | IRGACURE 907 *9 | | 1.00 | 5.5 | 1.00 | 5.2 | 1.00 | 5.2 | 1.00 | 5.2 |

TABLE 2-continued

|  |  | Comp. Ex. 1 | | Comp. Ex. 2 | | Comp. Ex. 3 | | Comp. Ex. 4 | |
|---|---|---|---|---|---|---|---|---|---|
| Curable composition | | Amount (g) | Composition ratio in terms of solid (% by mass) | Amount (g) | Composition ratio in terms of solid (% by mass) | Amount (g) | Composition ratio in terms of solid (% by mass) | Amount (g) | Composition ratio in terms of solid (% by mass) |
| Thiol | Thiol (Amount) | — | — | 1.00 | 5.20 | 1.00 | 5.20 | 1.00 | 5.20 |
|  | compound (Type) | | | PEMB | | DPMB | | PEMP | |
| Organic solvent | Cyclohexanone | 31.98 | — | 31.98 | — | 31.98 | — | 31.98 | — |
| Leveling agent | MEGAFACE R08 *10 | 0.02 | 0.1 | 0.02 | 0.1 | 0.02 | 0.1 | 0.02 | 0.1 |
| | Total | 99.0 | 100.0 | 100.0 | 100.0 | 100.0 | 100.0 | 100.0 | 100.0 |

The asterisks *1 to *10 in Table 1 represent:
*1: carbon black, manufactured by DEGUSSA
*2: titanium black, manufactured by Mitsubishi Materials Corporation
*3: pigment dispersing agent, manufactured by Ajinomoto Fine-Techno Co., Ltd.
*4: propylene glycol monomethyl ether acetate, manufactured by DAICEL CHEMICAL INDUSTRIES, LTD.
*5: diethylene glycol monoethyl ether acetate, manufactured by DAICEL CHEMICAL INDUSTRIES, LTD.
*6: 4-mole ethoxylated bisphenol A diacrylate, manufactured by KYOEISHA CHEMICAL CO., LTD.
*7: dipentaerythritol hexaacrylate, manufactured by TOAGOSEI CO., LTD.
*8: N,N-bis (diethylamino)benzophenone, manufactured by HODOGAYA CHEMICAL CO., LTD.
*9: 2-methyl-1-[4-(methylthio)phenyl]-2-morpholinopropan-1-one, manufactured by Ciba Specialty Chemicals
*10: fluorine compound, manufactured by DIC Corporation PEMB, DPMB and PEMP refer to pentaerythritol tetrakis(3-mercaptobutyrate), dipentaerythritol hexa(3-mercaptobutyrate) and pentaerythritol tetrakis(3-mercaptopropionate), respectively.

[Evaluation of Sensitivity of Curable Compositions]

The curable compositions of Examples 1 to 7 and Comparative Examples 1 to 4 were each spin coated on a glass substrate (100×100×1 mm) such that the dry thickness would be about 1 μm and were allowed to stand at room temperature for 30 minutes. Each coating film was dried at 70° C. for 20 minutes to remove the solvent, thereby forming a resist film. The thickness of the resist film was measured with a film thickness meter (SURFCOM 130A, manufactured by TOKYO SEIMITSU CO., LTD.). The resist film was then exposed to light through a quartz photomask with an exposure apparatus equipped with an ultrahigh pressure mercury lamp (Multilight ML-251 A/B, manufactured by USHIO INC.) while the dosage was automatically changed in stages, whereby the resist film was cured. The dosage was measured with an accumulated UV meter (UIT-150, receptor: UVD-S365, manufactured by USHIO INC.). The quartz photomask had a pattern in which the line/space widths were 5, 7, 10, 30, 50, 70 and 100 μm.

The exposed resist film was alkali developed for a predetermined time with an aqueous solution (25° C.) that contained 0.25% of an alkaline developer containing potassium carbonate (DEVELOPER 9033, manufactured by Shipley Far East Ltd.) and 0.03% of sodium dodecylbenzenesulfonate. The developing time was twice the time (tD) in which the film prior to the exposure was completely dissolved by the alkali development (In Examples, tD was 25 seconds). After the alkali development, the film was washed with water and the glass substrate was dried by air spraying. The thickness of the residual resist film was measured and the residual film rate was calculated as follows:

Residual film rate (%)=100×(thickness after alkali development)/(thickness before alkali development)

The above photocuring was carried out at varied dosages, and the correlations between the dosage and the residual film rate were plotted in a graph. The dosage at which the residual film rate was saturated was determined from the graph.

Separately, the line width of the resist that had been developed through the photomask wherein the line/space widths were 10 μm was determined with an optical microscope (VH-Z250, manufactured by KEYENCE CORPORATION).

Based on the above measurements, the dosage at which the residual film rate after the alkali development was saturated and at which the line width was equivalent to that (10 μm) of the photomask was determined as sensitivity of the photocurable composition. The results are shown in Table 3.

[Evaluation of Developability of Curable Compositions]

The photocurable compositions of Examples 1 to 7 and Comparative Examples 1 to 4 were each spin coated on a glass substrate (100×100×1 mm) such that the dry thickness would be about 1 μm and were allowed to stand at room temperature for 30 minutes. Each coating film was dried at 70° C. for 20 minutes to remove the solvent, thereby forming a resist film. The resist film was developed for a predetermined time with an aqueous solution (25° C.) that contained 0.25% of an alkaline developer containing potassium carbonate (DEVELOPER 9033, manufactured by Shipley Far East Ltd.) and 0.03% of sodium dodecylbenzenesulfonate. The time required for complete dissolution of the resist was determined. The results are shown in Table 3.

[Evaluation of Storage Stability of Curable Compositions]

The photocurable compositions of Examples 1 to 7 and Comparative Examples 1 to 4 were each weighed in an equal amount in respective glass containers, and the containers were closed with an aluminum foil while avoiding dusts or whatsoever entering in the containers. The samples were allowed to stand for 6 hours in respective constant-temperature units at 60° C., and were observed for any changes in state of the samples. The results are shown in Table 3. The symbols used in the table represent:

AA: No change
CC: Increased viscosity

TABLE 3

| | Sensitivity (mJ·cm$^2$) | Developing time (s) | Storage stability |
|---|---|---|---|
| Ex. 1 | 75 | 21.5 | AA |
| Ex. 2 | 100 | 17.8 | AA |
| Ex. 3 | 50 | 20.3 | CC |
| Ex. 4 | 100 | 19.5 | AA |
| Ex. 5 | 100 | 20.6 | AA |
| Ex. 6 | 100 | 19.7 | AA |

TABLE 3-continued

|  | Sensitivity (mJ · cm$^2$) | Developing time (s) | Storage stability |
|---|---|---|---|
| Ex. 7 | 75 | 20.6 | AA |
| Comp. Ex. 1 | 200 | 26.2 | AA |
| Comp. Ex. 2 | 75 | 23.8 | AA |
| Comp. Ex. 3 | 100 | 22.7 | AA |
| Comp. Ex. 4 | 50 | 23.4 | CC |

Table 3 shows that the curable compositions according to the present invention achieve good developability while ensuring sensitivity comparable to conventional thiol compounds by containing the hydroxythiol compounds. Optional selection of polyfunctional hydroxythiol compounds provides good stability of the compositions.

The invention claimed is:

1. A curable composition comprising one, or two or more hydroxythiol compounds represented by Formula (1) below, a compound with an ethylenically unsaturated double bond, and a thiol compound that is free of hydroxyl groups:

[Chem. 1]

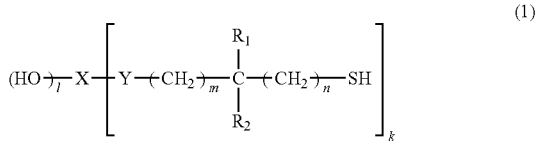

(1)

wherein one of $R_1$ and $R_2$ is a hydrogen atom and the other is a C1-C10 alkyl group; X is an aliphatic group, an aromatic ring-containing group or a heterocyclic ring-containing group; Y is an ester bond; k and l are each an integer ranging from 1 to 20; m is an integer of 0, 1 or 2; and n is 0.

2. The curable composition according to claim 1, wherein X in the hydroxythiol compound is a residue of a polyfunctional alcohol selected from the group consisting of alkylene glycols having a C2-10 optionally branched alkylene group, diethylene glycol, dipropylene glycol, glycerin, trimethylolpropane, pentaerythritol, dipentaerythritol, cyclohexanediol, cyclohexanedimethanol, norbornenedimethanol, tricyclodecanedimethanol, 1,3,5-trihydroxy-3-methylpentane, tris-2-hydroxy isocyanurate, tris(2-hydroxyethyl)isocyanurate, bisphenol A, hydrogenated bisphenol A, 2,2'-(4-(2-hydroxyethyl)phenyl)propane, 4,4'-(9-fluorenylidene)bis(2-phenoxyethanol), polyglycerin polyols and polycarbonate diols).

3. The curable composition according to claim 2, wherein the hydroxythiol compound has an ester derivative structure represented by Formula (2) below:

[Chem. 2]

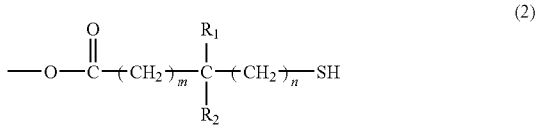

(2)

wherein $R_1$, $R_2$, m and n are the same as in Formula (1).

4. The curable composition according to claim 3, wherein the ester derivative structure of Formula (2) is 2-mercaptopropyl ester group, 3-mercaptobutyl ester group, 2-mercapto-3-methylbutyl ester group, 3-mercaptopentyl ester group or 3-mercapto-4-methylpentyl ester group.

5. The curable composition according to claim 4, wherein the composition further comprises a pigment.

6. The curable composition according to claim 5, wherein the pigment is at least one pigment selected from the group consisting of C. I. Pigment Yellow 12, 13, 14, 17, 20, 24, 55, 83, 86, 93, 109, 110, 117, 125, 137, 139, 147, 148, 153, 154, 166, 168, C. I. Pigment Orange 36, 43, 51, 55, 59, 61, C. I. Pigment Red 9, 97, 122, 123, 149, 168, 177, 180, 192, 215, 216, 217, 220, 223, 224, 226, 227, 228, 240, C. I. Pigment Violet 19, 23, 29, 30, 37, 40, 50, C. I. Pigment Blue 15, 15:1, 15:4, 15:6, 22, 60, 64, C. I. Pigment Green 7, 36, C. I. Pigment Brown 23, 25, 26, C. I. Pigment Black 7, and titanium black.

7. The curable composition according to claim 3, wherein the composition further comprises a pigment.

8. The curable composition according to claim 7, wherein the pigment is at least one pigment selected from the group consisting of C. I. Pigment Yellow 12, 13, 14, 17, 20, 24, 55, 83, 86, 93, 109, 110, 117, 125, 137, 139, 147, 148, 153, 154, 166, 168, C. I. Pigment Orange 36, 43, 51, 55, 59, 61, C. I. Pigment Red 9, 97, 122, 123, 149, 168, 177, 180, 192, 215, 216, 217, 220, 223, 224, 226, 227, 228, 240, C. I. Pigment Violet 19, 23, 29, 30, 37, 40, 50, C. I. Pigment Blue 15, 15:1, 15:4, 15:6, 22, 60, 64, C. I. Pigment Green 7, 36, C. I. Pigment Brown 23, 25, 26, C. I. Pigment Black 7, and titanium black.

9. The curable composition according to claim 2, wherein the composition further comprises a pigment.

10. The curable composition according to claim 9, wherein the pigment is at least one pigment selected from the group consisting of C. I. Pigment Yellow 12, 13, 14, 17, 20, 24, 55, 83, 86, 93, 109, 110, 117, 125, 137, 139, 147, 148, 153, 154, 166, 168, C. I. Pigment Orange 36, 43, 51, 55, 59, 61, C. I. Pigment Red 9, 97, 122, 123, 149, 168, 177, 180, 192, 215, 216, 217, 220, 223, 224, 226, 227, 228, 240, C. I. Pigment Violet 19, 23, 29, 30, 37, 40, 50, C. I. Pigment Blue 15, 15:1, 15:4, 15:6, 22, 60, 64, C. I. Pigment Green 7, 36, C. I. Pigment Brown 23, 25, 26, C. I. Pigment Black 7, and titanium black.

11. The curable composition according to claim 1, wherein the hydroxythiol compound has an ester derivative structure represented by Formula (2) below:

[Chem. 2]

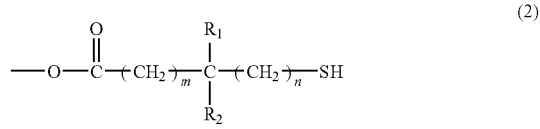

(2)

wherein $R_1$, $R_2$, m and n are the same as in Formula (1).

12. The curable composition according to claim 11, wherein the ester derivative structure of Formula (2) is 2-mercaptopropyl ester group, 3-mercaptobutyl ester group, 2-mercapto-3-methylbutyl ester group, 3-mercaptopentyl ester group or 3-mercapto-4-methylpentyl ester group.

13. The curable composition according to claim 12, wherein the composition further comprises a pigment.

14. The curable composition according to claim 13, wherein the pigment is at least one pigment selected from the group consisting of C. I. Pigment Yellow 12, 13, 14, 17, 20, 24, 55, 83, 86, 93, 109, 110, 117, 125, 137, 139, 147, 148, 153, 154, 166, 168, C. I. Pigment Orange 36, 43, 51, 55, 59, 61, C. I. Pigment Red 9, 97, 122, 123, 149, 168, 177, 180, 192, 215, 216, 217, 220, 223, 224, 226, 227, 228, 240, C. I. Pigment Violet 19, 23, 29, 30, 37, 40, 50, C. I. Pigment Blue 15, 15:1, 15:4, 15:6, 22, 60, 64, C. I. Pigment Green 7, 36, C. I. Pigment Brown 23, 25, 26, C. I. Pigment Black 7, and titanium black.

15. The curable composition according to claim 11, wherein the composition further comprises a pigment.

16. The curable composition according to claim 15, wherein the pigment is at least one pigment selected from the group consisting of C. I. Pigment Yellow 12, 13, 14, 17, 20, 24, 55, 83, 86, 93, 109, 110, 117, 125, 137, 139, 147, 148, 153, 154, 166, 168, C. I. Pigment Orange 36, 43, 51, 55, 59, 61, C. I. Pigment Red 9, 97, 122, 123, 149, 168, 177, 180, 192, 215, 216, 217, 220, 223, 224, 226, 227, 228, 240, C. I. Pigment Violet 19, 23, 29, 30, 37, 40, 50, C. I. Pigment Blue 15, 15:1, 15:4, 15:6, 22, 60, 64, C. I. Pigment Green 7, 36, C. I. Pigment Brown 23, 25, 26, C. I. Pigment Black 7, and titanium black.

17. The curable composition according to claim 1, wherein the composition further comprises a thermal polymerization or photopolymerization initiator.

18. A cured product obtained by curing the curable composition of claim 17.

19. A resist for color filters comprising the cured product of claim 18.

20. The curable composition according to claim 1, wherein the composition further comprises a pigment.

21. The curable composition according to claim 20, wherein the pigment is at least one pigment selected from the group consisting of C. I. Pigment Yellow 12, 13, 14, 17, 20, 24, 55, 83, 86, 93, 109, 110, 117, 125, 137, 139, 147, 148, 153, 154, 166, 168, C. I. Pigment Orange 36, 43, 51, 55, 59, 61, C. I. Pigment Red 9, 97, 122, 123, 149, 168, 177, 180, 192, 215, 216, 217, 220, 223, 224, 226, 227, 228, 240, C. I. Pigment Violet 19, 23, 29, 30, 37, 40, 50, C. I. Pigment Blue 15, 15:1, 15:4, 15:6, 22, 60, 64, C. I. Pigment Green 7, 36, C. I. Pigment Brown 23, 25, 26, C. I. Pigment Black 7, and titanium black.

* * * * *